United States Patent [19]
Roberts

[11] 4,121,128
[45] Oct. 17, 1978

[54] COLLECTIVE ION ACCELERATOR WITH FOIL-LESS BEAM EXTRACTION WINDOW

[75] Inventor: Thomas G. Roberts, Huntsville, Ala.

[73] Assignee: The United States of America as represented by the Secretary of the Army, Washington, D.C.

[21] Appl. No.: 824,673

[22] Filed: Aug. 15, 1977

Related U.S. Application Data

[63] Continuation-in-part of Ser. No. 668,877, Mar. 22, 1976, abandoned.

[51] Int. Cl.$^2$ .......................... H01J 7/16; H05H 1/00
[52] U.S. Cl. ...................................... 313/7; 313/361; 313/362; 313/363
[58] Field of Search .................. 313/231.3, 231.4, 361, 313/362, 363, 7; 250/423, 424, 426, 441

[56] References Cited

U.S. PATENT DOCUMENTS

| | | | |
|---|---|---|---|
| 2,640,948 | 6/1953 | Burrill | 313/7 X |
| 2,786,156 | 3/1957 | Lorenz | 313/7 |
| 2,809,314 | 10/1957 | Herb | 313/359 |
| 3,271,556 | 9/1966 | Harris | 313/363 X |
| 3,272,959 | 9/1966 | Browning | 313/7 X |

*Primary Examiner*—Palmer C. Demeo
*Attorney, Agent, or Firm*—Nathan Edelberg; Robert P. Gibson; Harold W. Hilton

[57] ABSTRACT

Ions are generated in a vacuum condition of an ion accelerator and injected through three aerodynamic windows to atmosphere pressure. In its travel through the windows the coil provides a magnetic field to prevent the ion beam from dissipating while it is traveling to the atmosphere.

5 Claims, 4 Drawing Figures

COLLECTIVE ION ACCELERATOR WITH FOIL-LESS BEAM EXTRACTION WINDOW

DEDICATORY CLAUSE

The invention described herein may be manufactured, used, and licensed by or for the Government for governmental purposes without the payment to me of any royalties thereon.

CROSS-REFERENCE TO RELATED APPLICATION

This application is a continuation-in-part of applicant's copending application Ser. No. 668,877, filed Mar. 22, 1976, and now abandoned.

BACKGROUND OF THE INVENTION

The autoresonant accelerator is a combination of the traveling-wave and collective accelerator concepts. The medium in which the wave travels is a relativistic electron beam immersed in a dc magnetic field. This traveling wave has the property that its phase velocity increases with decreasing magnetic field. In order to accelerate ions which are in resonance with the wave, the phase velocity of the wave must be adiabatically increased from a low phase velocity at the input end of the accelerator where the ions are loaded onto the wave to a higher phase velocity at the output end of the accelerator where the ion beam must be extracted without loss of beam quality due to scattering.

For all applications of the very high energy ion beams which require propagation through the atmosphere, it is necessary to extract the beam with as little loss of beam quality as practical. Here beam quality is determined by the ratio of energy due to transverse motion (that is temperature as measured in a frame moving with the velocity of the beam) to the energy due to motion in the beams direction as measured in the labs frame. The pressure in the accelerator tube and the high voltage diode of the electron beam generator is of the order of $10^{-4}$ torr or less. Some means must be used to prevent leakage of the ambient atmosphere into the accelerator tube where the ion beam is extracted. The simplest means of supporting the pressure difference would be with a solid thin film window. However, available windows absorb energy from the beam and reduce the beam quality due to scattering. At these high energy fluxes (approximately $5 \times 10^{12}$ watts for 270 nanoseconds) the heating caused by the absorption of even a very small fraction of the beam energy not only scatters the beam particles but it also weakens the window causing it to rupture so that the accelerator cannot be operated again until the window has been replaced and the vacuum in the accelerator reestablished. Differential pumping using vacuum pumps might be possible but pumping speeds like $3.5 \times 10^8$ liters/sec at $10^{-4}$ torr would be required for an aperture of only 1 cm$^2$, which is smaller than the apertures required here.

DESCRIPTION OF THE PREFERRED EMBODIMENT

Figure 1:
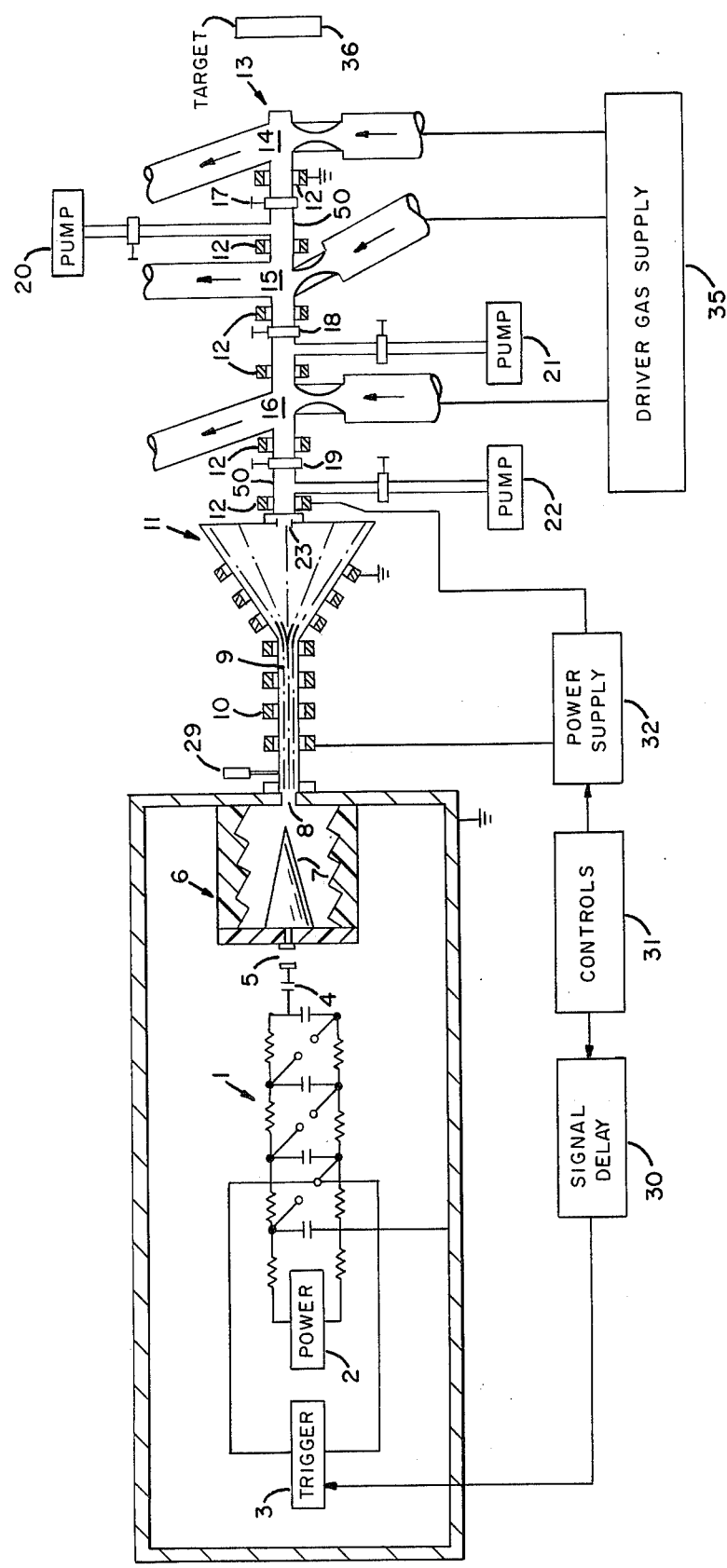
FIG. 1 illustrates diagrammatically and schematically the preferred embodiment of the invention.

In the Figure, the autoresonant accelerator consists of a multistage Marx bank 1 (only four stages have been shown) with power supply 2 and triggering circuit 3. A peaking capacitor 4 is used to keep the switch 5 from breaking down until the voltage has reached a desired high value and to sustain the voltage after switch 5 does break down. When the switch 5 does break down, the charge from the Marx bank is transferred to the high voltage diode 6, and this causes electrons to be emitted from the cathode 7. These electrons are accelerated across the electrode gap and passed through the aperture 8 where they find themselves in the accelerator proper. Prior to this time due to signal delay 30, controls 31, and power supplies 32, a magnetic field 9 along the accelerator has been established by energizing the coils 10. This causes the electrons to propagate along the field lines until they strike the end of the accelerator tube 11.

Ions are injected by the ion injector 29 just prior to the arrival of the high energy electron beam from the high voltage diode. Note, the electron beam has not been shown in the drawing. Also the ion injector 29 may be simply a puff of hydrogen gas in which case the high energy electrons produce the ions in situ, or it may be one of the more sophisticated ion injectors. For example, see "A Proposed High-Current Nanosecond Source of Energetic Ions for Auto Resonance Accelerators," J. Plasma Physics, Vol. 13, Part 2, pp. 361-366, 1975.

The ions are focused near the axis by the electrostatic potential produced by the presence of the electron beam. The electric field of the wave is established in the nonexpanding section of the accelerator tube where the phase velocity is low, and the ions become loaded onto the wave. The wave is made to grow in the expanding section of the accelerator tube where the phase velocity is increasing, and the trapped ions are accelerated along the axis until they reach 11. At the plate 11 it becomes necessary to extract the ion beam to use magnetic-optics to shape and prepare the beam for injection into the atmosphere for propagation to the desired target 36. The distance to the target and the nature of the target depends on the application being studied. The magnetic coils 12 about tube 50 are energized at the same time coils 10 are energized. The tube 50 is metallic. It may be of steel or any of many other materials. Connections from supplies 32, provide the power. Coils 12 produce the magnetic-optics which prepares the beam and propagates the beam to the end of the substantially large extraction window at 13.

The extraction window as shown consists of three (known in the art) aerodynamic windows and three pumping stations. The windows are constructed of steel and are operated by supplying gas, such as N$_2$, at the proper pressure and temperature. The windows have no moving parts. Starting at the output end, the first window 14 is an expansion window which drops the pressure to approximately 7.6 torr. The second window 15 is a compression window which drops the pressure to approximately 0.076 torr, and the third window 16 is a shock expansion window which drops the pressure to approximately 0.0076 torr. This is as low as the pressure can be dropped for an aperture of the large size considered here.

Each of the windows are separated from the accelerator tube by valves 17, 18, and 19. These valves are used in starting the system as explained below. Each window is also separated from the accelerator tube by a pumping station 20, 21, and 22. Pumping stations 20 and 21 consist of only a small mechanical forepump and are only used to start the system as explained below. However, pumping station 22 is used to reduce the pressure from $7.6 \times 10^{-3}$ torr down to $10^{-4}$ torr or less by differential pumping which is a modest requirement.

Although three different types of aerodynamic windows have been shown, any one of the types could have been used three times, and it is to be understood that other types of aerodynamic windows may be used as they are perfected. Also, it is really only necessary to use two windows, but here three were used to reduce the requirement for differential pumping to a minimum.

Figure 2:
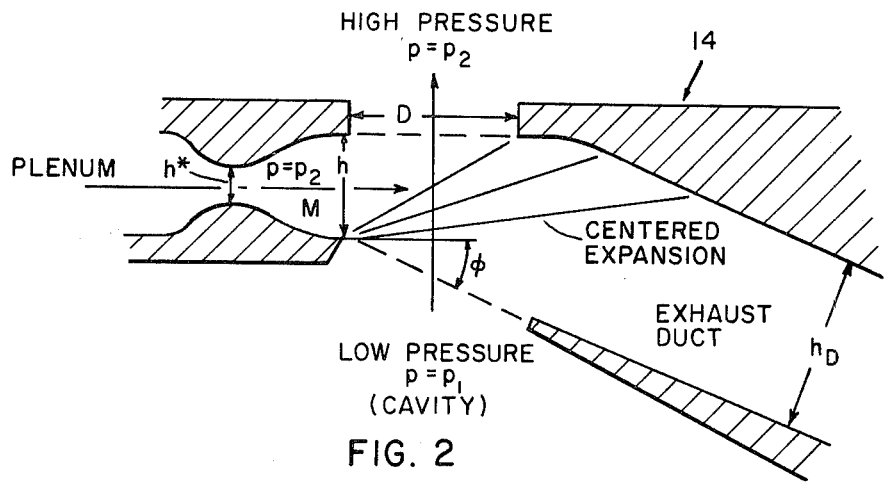
FIG. 2 is a diagrammatic view of an expansion window.
Figure 3:
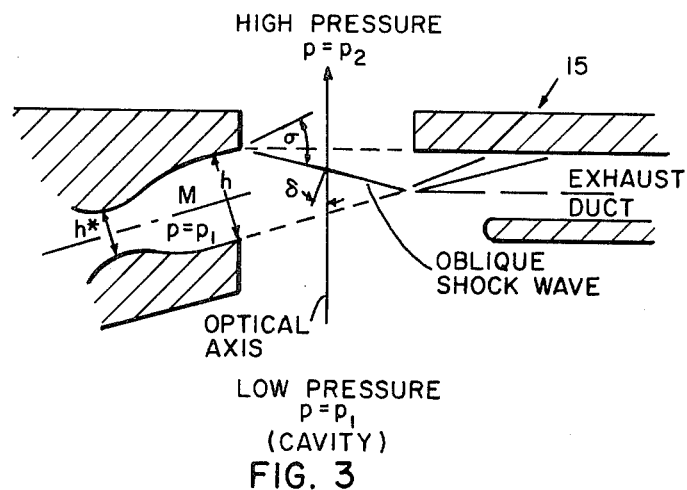
FIG. 3 is a diagrammatic view of a compression window.
Figure 4:
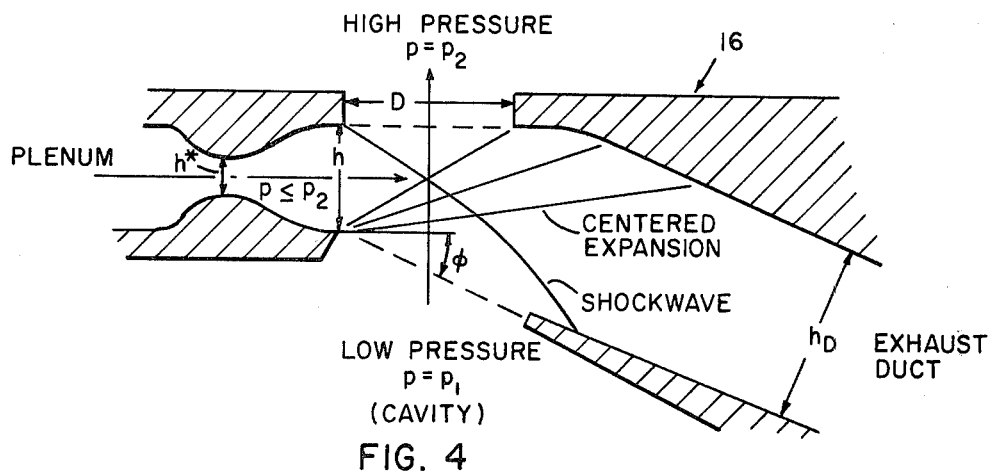
FIG. 4 is a diagrammatic view of a shock-expansion window.

The three types of aerodynamic windows used in the preferred embodiment of this disclosure are illustrated in FIGS. 2 through 4. FIG. 2 shows an expansion window; FIG. 3 shows a compression window; and FIG. 4 shows a shock-expansion window. The mass flow required for operation of these supersonic aerodynamic windows is supplied by conventional gas bottles and may be determined from $$\dot{m} = 2/(\gamma + 1) (\gamma + 1)/2(\gamma - 1) (\gamma/RT_o)^{1/2} P_2 a_c D^2/(P_2/P_1)$$

for the compression window and $$\dot{m} = 2/(\gamma + 1) (\gamma + 1)/2(\gamma - 1) (\gamma/RT_o)^{1/2} P_2 a_E D^2$$

for the expansion window,

Where $\gamma$ is the ratio of specific heats, R is the gas constant, $T_o$ is the stagnation temperature, $P_2$ is the pressure on the high pressure side of the window, $P_1$ is the pressure on the low pressure side of the window, D is aperture radius, and the $\alpha$'s are functions of $h^*/h$, $h/D$, and $P_o/P_1$ where $h^*$ is the throat height, $h$ is the nozzle exit height and $P_o$ is the stagnation pressure. The shock-expansion window requires a little less flow rate than either the expansion window or the compression window. In the application here disclosed the window where $P_2$ = atmospheric pressure requires mass flow rates of the order of a few lbs/sec.

For a detailed disclosure of aerodynamic windows see "Supersonic Flow Aerodynamic Windows for High Powered Lasers" by E. M. Parmentier and R. A. Greenberg, AIAA Journal, Volume 11, No. 7, July 1973. Also see "Aerodynamic Windows for Laser Beams" by E. Zimet, Naval Ordnance Laboratory Report, NOLTR 73-66, 1973. Details of an accelerator is disclosed in U.S. Pat. No. 3,887,832 entitled "Auto-Resonant Acceleration of Ions" issued to Sloan et al. on June 3, 1975.

In operation the required vaccum is established in the accelerator tube and the high voltage diode using pumps, not shown. The pressure behind valve 17 is reduced to a few torr by pump 20. The pressure beind valve 18 is reduced to a few hundreds of a torr by pump 21 and pump 22 is started. Gas is supplied to windows 14, 15, and 16 by supplier 35. After these windows have begun to operate properly, valves 17, 18, and 19 are opened (this can be done electronically). Next the Marx bank is charged. A signal from control unit 31 causes the magnetic coils 10 and 12 to become energized. This same signal is delayed a preset amount before being used to start the Marx bank triggering circuit and the ion injector. The Marx bank is erected in approximately 100 nanoseconds. Thus producing the high energy electron beam which encounters the gas from the ion injector. The gas is ionized by the high energy electron beam. The high energy electrons propagate down the accelerator tube along the magnetic field lines to the end of the tube where most of them strike the plate 11. In this configuration the electron beam is produced for approximately 300 nanoseconds, and during this time the accelerating wave is established in the nonexpanding section of the accelerator tube where the magnetic field is large and the phase velocity is low, so that the ions become loaded onto the wave.

In the expanding section of the accelerator tube the magnetic field is decreasing and the phase velocity is increasing, therefore, the wave is growing and the ions are accelerated. At 11 the ion beam (and a small part of the electron beam unless electric fields are applied just prior to 11 to deflect them out of the beam) enter the extraction window through aperture 23 into tube 50. The ion is kept from dissipating by the magnetic optics created by coil 12. The ion beam propagates through tube 50 and the extraction windows where it is shaped and injected into the atmosphere. The material (gases) that the ion beam passes through in propagating down tube 50 to the extraction window is completely negligible compared to a thin solid window, and thus introduces only a minimum amount of loss of beam quality. As is known in the art the ion beam will dissipate in a partial vacuum which is present in the tube 50 up to aerodynamic window 14; therefore coil 12 wrapped around tube 50 is necessary to provide a magnetic field to hold the ion beam together. Coil 12 may take the shape of multiple poles. Once in the atmosphere however the ion beam will hold together because the beam space charge will be neutralized by the plasma generated in the atmosphere.

The coils 10 and 12 produce different magnetic field strengths. Coil 10 produces a field of from 20 to 150 Kilogauss in the small diameter section and the field strength is decreased in the funnel shaped accelerator tube to 2 to 10 Kilogauss depending on the energy to which the ions are to be accelerated. The coil 12 needs to produce field strengths sufficient to prevent the ion beam from blowing up due to space charge effects, say, 1 to 2 Kilogauss or less depending on the charge density or current density of the ion beam.

Any of several gases may be used; however, the device of the present invention preferably uses $N_2$.

The target 36 is at a substantial distance from window 13 and propagation through the atmosphere places requirements on the ion energy and currents that must be produced.

I claim:

1. In an ion beam generating system including an evacuated ion accelerator and an ion extraction window spaced downstream therefrom, the improvement comprising:

(a) means for generating electrons for flow through said accelerator;
   (b) means for injecting ions into said electron flow in said ion accelerator;
   (c) means for connecting said accelerator to said ion extraction window; and
   (d) a plurality of aerodynamic windows disposed in serial spaced relation along said connecting means, each said aerodynamic window being disposed for decreasing the pressure in said connecting means in a predetermined stepped relation.

2. In a system as set forth in claim 1 further comprising magnetic means connected around said connecting means, so as to provide a magnetic field to prevent said ion beam from dissipating before it reaches the atmospheric pressure.

3. In a system as set forth in claim 2 further having a first vacuum pump connected to said connecting means betweenn said ion accelerator and the first one of said spaced aerodynamic windows.

4. In a system as set forth in claim 3 wherein said plurality of aerodynamic windows comprises three aerodynamic windows.

5. In a system as set forth in claim 4 including a second vacuum pump connected to said connecting means intermediate the first and second of said three aerodynamic windows, and a third vacuum pump connected to said connecting means intermediate the second and third of said three aerodynamic windows, and a valve disposed between each said vacuum pump and said connecting means.

* * * * *